(12) United States Patent
Cooper et al.

(10) Patent No.: US 8,237,788 B2
(45) Date of Patent: Aug. 7, 2012

(54) METHODS OF AUTOMATIC GEOMETRIC CALIBRATION USING LASER SCANNING REFLECTOMETRY

(75) Inventors: Guthrie Cooper, Mill Spring, NC (US); Christopher Knaack, Bay Village, OH (US)

(73) Assignee: 3D Systems, Inc., Rock Hill, SC (US)

( * ) Notice: Subject to any disclaimer, the term of this patent is extended or adjusted under 35 U.S.C. 154(b) by 978 days.

(21) Appl. No.: 12/196,810

(22) Filed: Aug. 22, 2008

(65) Prior Publication Data

US 2009/0060386 A1 Mar. 5, 2009

Related U.S. Application Data

(60) Provisional application No. 60/957,576, filed on Aug. 23, 2007.

(51) Int. Cl.
*H04N 7/18* (2006.01)
(52) U.S. Cl. ............................ 348/86; 356/616; 382/287
(58) Field of Classification Search .................... 348/86, 348/87, 135, 207, 373; 356/228, 243, 243.1, 356/243.4, 601, 620, 625; 382/151, 254, 382/291–294
See application file for complete search history.

(56) References Cited

U.S. PATENT DOCUMENTS

| | | | |
|---|---|---|---|
| 4,385,238 A | 5/1983 | Westerberg et al. | |
| 4,713,537 A * | 12/1987 | Kunz et al. | 250/252.1 |
| 4,999,764 A * | 3/1991 | Ainsworth et al. | 700/58 |
| 5,058,988 A | 10/1991 | Spence | |
| 5,059,021 A | 10/1991 | Spence et al. | |
| 5,123,734 A * | 6/1992 | Spence et al. | 356/121 |
| 5,133,987 A | 7/1992 | Spence et al. | |
| 5,145,432 A | 9/1992 | Midland et al. | |
| 5,182,715 A | 1/1993 | Vorgitch et al. | |
| 5,267,013 A * | 11/1993 | Spence | 356/121 |
| 5,430,666 A * | 7/1995 | DeAngelis et al. | 250/491.1 |
| 5,495,328 A | 2/1996 | Spence et al. | |
| 5,610,824 A | 3/1997 | Vinson et al. | |
| 5,832,415 A | 11/1998 | Wilkening et al. | |
| 5,978,080 A | 11/1999 | Michael et al. | |
| 5,978,521 A | 11/1999 | Wallack et al. | |

(Continued)

OTHER PUBLICATIONS

Non-final rejection dated Sep. 24, 2010 in related U.S. Appl. No. 12/196,778.

(Continued)

*Primary Examiner* — Annan Shang
(74) *Attorney, Agent, or Firm* — Keith A. Roberson

(57) ABSTRACT

Systems and methods for calibrating a solid-imaging system (10) are disclosed. A calibration plate (110) having a non-scattering surface (140) with a plurality (150) of light-scattering fiducial marks (156) in a periodic array is disposed in the solid-imaging system. The actinic laser beam (26) is scanned over the fiducial marks, and the scattered light (26S) is detected by a detector (130) residing above the calibration plate. A computer control system (30) is configured to control the steering of the light beam and to process the detector signals (SD) so as to measure actual center positions ($x_A, y_A$) of the fiducial marks and perform an interpolation that establishes a calibrated relationship between the angular positions of the mirrors and (x,y) locations at the build plane (23). The calibrated relationship is then used to steer the laser beam in forming a three-dimensional object (50).

20 Claims, 12 Drawing Sheets

U.S. PATENT DOCUMENTS

| | | | |
|---|---|---|---|
| 6,325,961 B1 | 12/2001 | Beers et al. | |
| 6,445,813 B1* | 9/2002 | Ikurumi et al. | 382/147 |
| 6,501,061 B1* | 12/2002 | Kitai et al. | 250/205 |
| 6,622,062 B1 | 9/2003 | Earl et al. | |
| 6,646,728 B1 | 11/2003 | Tang et al. | |
| 6,798,925 B1 | 9/2004 | Wagman | |
| 6,863,362 B2 | 3/2005 | Reichel et al. | |
| 6,948,254 B2* | 9/2005 | Stiblert et al. | 33/502 |
| 7,064,318 B2 | 6/2006 | Bui | |
| 7,225,044 B2 | 5/2007 | Hiatt et al. | |
| 7,454,052 B2* | 11/2008 | Smilansky et al. | 382/149 |
| 7,692,144 B2* | 4/2010 | Watanabe et al. | 250/307 |
| 8,040,530 B2* | 10/2011 | Cooper | 356/616 |
| 2002/0105577 A1* | 8/2002 | Nikawa | 348/86 |

OTHER PUBLICATIONS

Final rejection dated Feb. 16, 2011 in related U.S. Appl. No. 12/196,778.

Non-Final Office Action for U.S. Appl. No. 12/196,778, dated Sep. 24, 2010.

Final Office Action for U.S. Appl. No. 12/196,778, dated Feb. 16, 2011.

Examiner's Amendment for U.S. Appl. No. 12/196,778, dated Jul. 14, 2011.

CleanStation® SRS product literature from PM Technologies available at http://www.pm3tech.com/pdf/CS_SRS-DT3.pdf.

PCT Search Report for International Application No. PCT/US2008/074021.

\* cited by examiner

METHODS OF AUTOMATIC GEOMETRIC CALIBRATION USING LASER SCANNING REFLECTOMETRY

CLAIM OF PRIORITY

This application claims the benefit of priority under 35 U.S.C. §119(e) of U.S. Provisional Application Ser. No. 60/957,576, filed on Aug. 23, 2007, which application is incorporated by reference herein.

BACKGROUND OF THE INVENTION

1. Field of the Invention

This invention relates to methods and apparatus for calibrating solid-imaging devices.

2. Technical Background

Solid-imaging devices have been used for rapid prototyping for models for product development, and, more recently for manufacturing operations. Solid-imaging devices produce three-dimensional objects from fusible powders or photocurable liquids, typically by exposure to radiation in response to computer control. Data representing cross-sectional layers of a three-dimensional object provide the computer with control parameters for programs for automated building of the object, typically layer-by-layer. A laser or other source of actinic radiation suitable for solid imaging sequentially irradiates individual thin layers of the build material in response to which the material transforms layer-upon-layer into a solid, to create a solid imaging product. Example stereolithography apparatus is describe in U.S. Pat. Nos. 4,575,330 and 5,495,328, which patents are incorporated by reference herein.

Solid imaging is sometimes referred to as "rapid prototyping and manufacturing" and includes such diverse techniques as stereolithography, laser sintering, ink jet printing, and others. Powders, liquids, jettable phase-change materials, and other materials for solid imaging are sometimes referred to as "build materials." The three-dimensional objects that solid imaging techniques produce are sometimes called "builds," "parts," "objects," and "solid imaging products," which can be formed as a variety of shapes and sizes.

The builds are usually prepared on surfaces referred to as "build pads" or "build platforms," which can be raised or lowered to place the surface of a build into contact with the actinic radiation and the "working surface" or "build plane" or "image plane" where the build material is exposed.

Despite the variety of devices and methods developed for solid imaging, a number of drawbacks have yet to be resolved in order to make the process more efficient and less costly. This includes for example, improving the otherwise complex and tedious alignment steps for aligning the radiation source and the image plane so that the object is properly formed.

SUMMARY OF THE INVENTION

The present invention is directed to methods and apparatus for calibrating a solid-imaging device that forms a three-dimensional object, and in particular calibrating the scan of a laser in such a device over a planar surface. The calibration is performed in a manner that accounts for local and global geometric errors so that the laser beam is accurately and precisely directed when forming the three-dimensional object.

An aspect of the method involves obtaining a sufficient number of position measurements to provide an iterative solution to unknown parameters of a predefined nonlinear model that governs laser scanning kinematics. The position measurements are generated by laser scanning a flat and level calibration plate having a substantially non-scattering surface and a periodic array of fiducial marks, which are formed in or on the non-scattering surface and which scatter actinic light. A detector is arranged above the calibration plate receives the scattered light from the fiducial marks as the laser scans over the calibration plate.

Another aspect of the invention is a method of calibrating a solid-imaging system that forms a three-dimensional object and that has a mirror-based optical system for generating and steering a light beam having an actinic wavelength. The solid-imaging system has an elevator system that movably supports a build platform for building the object. The method includes operably disposing a calibration plate onto the build platform. The calibration plate has a periodic array of fiducial marks formed on a substantially non-scattering background, wherein the fiducial marks are configured to scatter the actinic light. The method also includes performing a first scan of the light beam over first and second orthogonal rows of fiducial marks and detecting scattered light therefrom so as to establish a first coordinate system that is used to establish first or "theoretical" center positions of the other fiducial marks in the fiducial mark array. The first and second orthogonal rows are preferably the center X and Y rows. The method also includes using the first coordinate system to perform a second scan of the light beam over at least a portion of the array of fiducial marks and detecting scattered light therefrom so as to measure corresponding center positions of the second-scanned fiducial marks. The method further includes using interpolation of the measured center positions and the angular positions of the mirrors to establish a calibrated relationship between mirror angular positions and the (x,y) build plane positions.

The calibration method is substantially immune to thermal environmental variables, and the calibration process can typically be completed in less than one hour.

The above-described method meets the calibration criteria of being fast, having no movement of the solid-imaging system (other than the scanning mirrors), and being relatively low cost. The computer controller of the solid-imaging system is preferably used for the calibration apparatus and is provide with instructions (e.g., software) stored on a computer-readable medium that recognizes when the laser beam has found the center of each fiducial mark via an algorithm that matches the detector signals associated with the light scattered from the fiducial mark to the known size of the mark and performs an intelligent pattern-matching search. Any change in laser power during the scan has minimal effect, particularly in example methods that employ multiple scans of the fiducial marks that are then averaged together.

In order to model the system errors as close as possible so that the calibration is highly accurate and precise, all of the system unknowns must be iteratively found and reintroduced, so that each set of smaller errors can be identified. A single detector disposed above the calibration plate provides a central location for receiving data from the calibration plate and allows for a complete scan of the plate in a matter of minutes instead of hours. This time savings allows for the calibration apparatus to obtain a sufficient amount of position measurement information so that the necessary number of iterative calculations can be performed to provide a calibration that is approximate the limit of the calibration apparatus's capability.

Additional features and advantages of the invention will be set forth in the detailed description that follows, and in part will be readily apparent to those skilled in the art from that description or recognized by practicing the invention as described herein, including the detailed description that follows, the claims, as well as the appended drawings. It is to be understood that both the foregoing general description and the following detailed description present example embodiments of the invention, and are intended to provide an overview or framework for understanding the nature and character of the invention as it is claimed. The accompanying drawings are included to provide a further understanding of the invention, and are incorporated into and constitute a part of this specification. The drawings illustrate various embodiments of the invention, and together with the detailed description, serve to explain the principles and operations thereof.

DETAILED DESCRIPTION OF THE INVENTION

The present invention now will be described more fully hereinafter with reference to the accompanying drawings, in which some, but not all embodiments of the invention are shown. Indeed, the invention may be embodied in many different forms and should not be construed as limited to the embodiments set forth herein; rather, these embodiments are provided so that this disclosure will satisfy applicable legal requirements. The present invention is directed to methods and apparatus for calibrating solid-imaging devices. An example solid-imaging device in the form of a stereolithography system is considered below by way of example, followed by a description of calibration criteria. These are followed by a description of the methods and systems of the present invention used to calibrate the stereolithography system.

Example Stereolithography System

Figure 1:
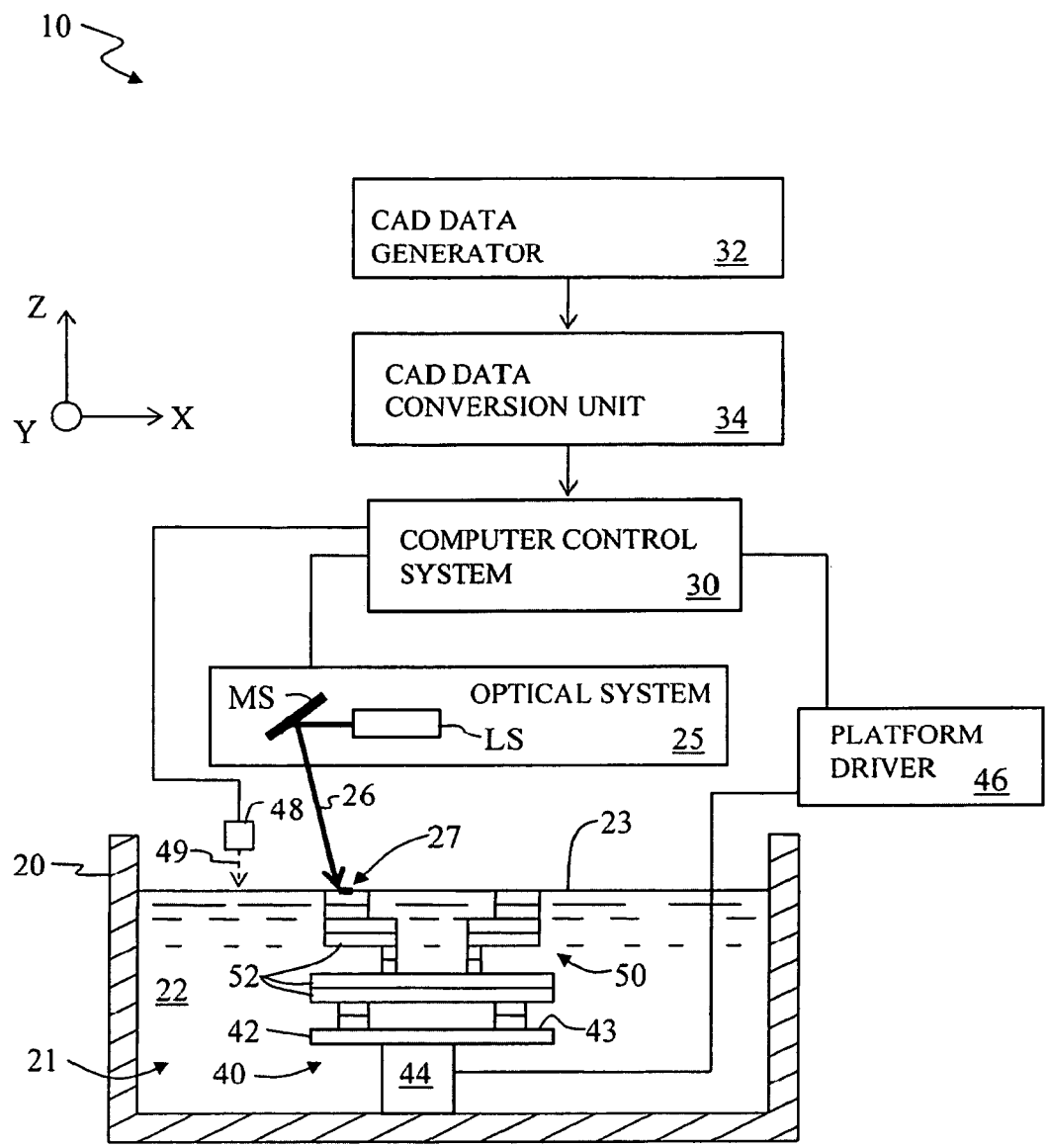
FIG. 1 is a schematic diagram of an example embodiment of a solid-imaging system in the form of a stereolithographic system shown in an elevational cross-section.

FIG. 1 is a schematic diagram of a solid-imaging system in the form of a stereolithographic system 10 shown in an elevational cross-section. A right-handed Cartesian coordinate system is provided for the sake of reference. System 10 includes a container 20 having an interior region 21 (referred as a "build chamber") that is filled with a UV-curable liquid 22, or the like, to provide a designated working surface or build plane 23 as defined by the level of the liquid. The term "build plane" as used herein also refers to the location in container 20 where the build plane 23 would or could be if liquid 22 were present.

A mirror-based optical system 25 includes a mirror system MS and a laser source LS or other light beam generator (including but not limited to laser diodes, light emitting diodes, and the like) configured to provide an actinic (i.e., ultraviolet) beam of light 26 that produces a spot ("laser spot") 27 in the plane of working surface 23. As used herein, "actinic" light includes any and all electromagnetic radiation that produces a photochemical reaction in the material that absorbs the electromagnetic radiation. Such actinic light includes, but is not limited to, radiation that results in crosslinking of any radiocrosslinkable material that absorbs the radiation. Optical system 25 is configured to move the light beam, such as laser spot 27, across build plane 23 in order to build an object 50. The movement or "steering" of laser spot 27 over build plane 23 is accomplished by adjusting mirror system MS along with other optical and/or mechanical elements (not shown) in optical system 26. In an example embodiment, optical system 25 is configured to adjust the size (i.e., diameter or width $W_{LS}$; see FIG. 11A) of laser spot 27 to adjust the resolution of the laser scan and the resolution of the build process.

In an example embodiment, the steering of laser spot 27 over surface 23 is controlled by a computer control system 30. In an example embodiment, computer control system 30 controls such steering based on computer-aided design (CAD) data produced by a CAD data generator 32 in a CAD design system or the like. CAD generator 32 in turn is operably connected to a computerized CAD data conversion system 34, which is operably connected to (or is included within) computer control system 30. CAD data conversion system 34 is configured to covert the CAD data from CAD data generator 32 into a suitable stereolithographic layer data format so that the controller can steer laser spot 27 in a manner that forms object 50.

System 10 includes an elevator system 40 operably connected to computer control system 30 (also called a platform surface). Elevator system 40 includes a movable build platform 42 that has an upper surface 43. The build platform 42 is operatively connected to an elevator drive 44, such as a drive screw, piston base, or the like, controlled by the platform driver 46. The elevator drive 44 selectively moves the build platform 42 up and down (i.e., along the Z-direction) via the platform driver 46 under the control of computer control system 30.

System 10 further includes a laser leveling system 48 that is operably connected to computer control system 30. Laser leveling system 48 is configured to generate a laser beam 49 that reflects off of whatever surface is placed therebeneath so as to measure the level of the surface relative to a horizontal reference plane.

Build plane 23 of UV-curable liquid 22 is maintained at a constant level in container 20, and laser spot 27, or other suitable form of reactive stimulation, of sufficient intensity to cure the liquid and convert it to a solid material, is moved across the build plane in a programmed manner. As UV-curable liquid 22 cures and solid material forms, elevator platform 42 (which was initially just below build plane 23) is moved down from the build plane in a programmed manner via the operation of elevator driver 44. In this way, the solid material that was initially formed is taken below build plane 23 and new liquid 22 is introduced to the build plane, with or without the assistance of a recoating device or the like. A portion of this new liquid is, in turn, converted to solid material by actinic light 26 from laser spot 27, and the new material adhesively connects to the material below it. As the device operates, it produces the three-dimensional object 50 by step-wise buildup of integrated layers (laminae) 52.

This process is continued until the entire three-dimensional object 50 is built upon platform surface 43. Object 50 is then removed from container 20, and the apparatus is ready to produce another object. Another of the same object can then be produced, or some new object can be made by changing the CAD data provided to computer control system 30.

Optical System

Figure 2:
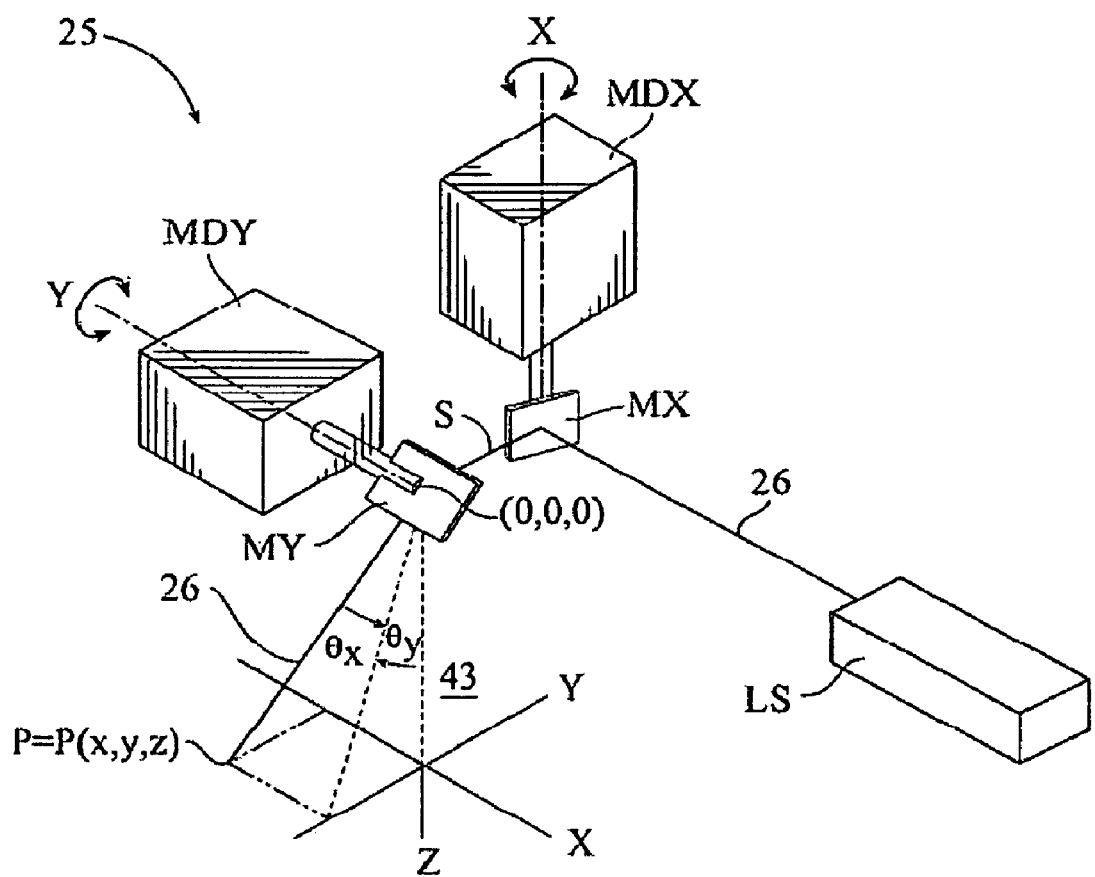
FIG. 2 is a close-up perspective view of a portion of the optical system of the system of FIG. 1, that shows an example mirror system along with the angular coordinates ($\theta_X$, $\theta_Y$) and their relationship to the Cartesian coordinates (x, y, z) associated with the build plane.

FIG. 2 is a close-up perspective view of a portion of mirror-based optical system 25 that shows an example mirror system MS and the relationship between the angular coordinates ($\theta_X, \theta_Y$) of the mirror system and the Cartesian coordinates (x,y,z) associated with platform surface 43. Mirror system MS includes first and second mirrors MX and MY that are mechanically rotated about respective axes X and Y via respective mirror drivers (e.g., mirror motors or galvanometers) MDX and MDY, respectively. Mirror motors MDX and MDY are operably connected to and controlled by computer controller 30. Mirror MX controls the X-coordinate at platform surface 43 and mirror MY controls the Y-coordinate at the platform surface. Laser beam 26 generated by laser LS is directed to point P=P(x,y,z) by operation of mirrors MX and MY under the control of mirror motors MDX and MDY, respectively, wherein the origin at calibration plate surface 132 is taken to be at the center of Y-dimension mirror MY, at its axis of rotation. Calibration plate surface 132 is at a distance Z away from the center of Y-dimension mirror MY. The angle $\theta_Y$ corresponds to the angle of laser beam 26 from the vertical in the Y-dimension, and the angle $\theta_X$ corresponds to the angle of laser beam 26 from the vertical in the X-dimension.

Considering S to be the distance (spacing) between the center of the Y-dimension mirror MY (at its axis of rotation) and the center of the X-dimension mirror MX, and according to well-known relationships in the field of laser scanning of a planar surface according to this system, one may determine corrected values of the angle of laser beam 26 from the vertical in order to irradiate point P as follows:

$\theta_Y = TAN^{-1}(y/Z)$ $\theta_X = TAN^{-1}(x/((Z^2+Y^2)^{1/2}+S))$

The focal radius FR (not shown) may also be found for this system in the conventional manner, as follows:

$FR = [((Z^2+Y^2)^{1/2}+S)^2+X^2]^{1/2}$

Given these relationships, one may correct for the geometric error caused by the planar surface of mirrors MX and MY, and their separation S, for a given distance Z between platform surface 43 and the Y-dimension mirror MY.

Calibration Criteria

There are a number of criteria that should be met by a calibration apparatus for a solid-imaging device. For example, in order to reduce the "shingling" effect of a solidified layer of a formed part, the laser beam must subtend an angle close to 90 degrees to the build plane. This is accomplished by having a large distance from the scanning mirrors to the build plane. This large working distance hinders the calibration procedure because any imperfections in the geometry of the scanning system are magnified, such as mirror mounting imperfections, chamber window inhomogeneity and non-flatness, mirror shaft warpage, and galvomotor (i.e., mirror motor) non-parallel mounting.

Furthermore, the theoretical mapping of the angular coordinates associated with a pair of scanning mirrors to the build plane has an inherent difficulty that is known to those skilled in the art of laser scanning. The difficulty is that the mapping of the coordinate systems is nonlinear due to the laser beam not originating from a central point in space, but rather, from two points of unknown entrance and exit vectors. This configuration draws an arc rather than a line at the build plane, and creates a mapping error in the form of pincushion distortion.

Another criterion is that there can be no movement of the solid-imaging device in any direction or rotation about any axis during data collection other than by the scanning mirrors. Any movement could be accounted in the calculations, but it would be limited in accuracy to how well the movement was detected. Any rotation at all greatly distorts the error map, and such rotation is difficult to measure at the accuracy required.

Also, the exact angle and position of entry of the laser beam to each mirror, the distance between the mirrors, and the distance from the second mirror to the build plane are unknown. The combination of imaging nonlinearity, coupled with the number of unknown parameters and the various possible geometric imperfections require that large amounts of data are needed to achieve the desire accuracy.

Another criterion is that the calibration must be relatively fast, i.e., preferably performed in less than one hour, so that any expansion or contraction of the system due to temperature and humidity over the course of the calibration measurement will be negligible. A related criterion is that the relatively large amount of computational information must be processed without significant delay and should be "in-situ" so that a second iteration of the calibration measurement may be performed without having to re-install any calibration equipment.

Calibration Apparatus

As discussed above, prior to operating system 10 to build object 50, the system needs to be calibrated so that laser spot 27 is steered to the desired object coordinates with a high degree of precision and accuracy so that the intended object is faithfully reproduced.

Figure 3:
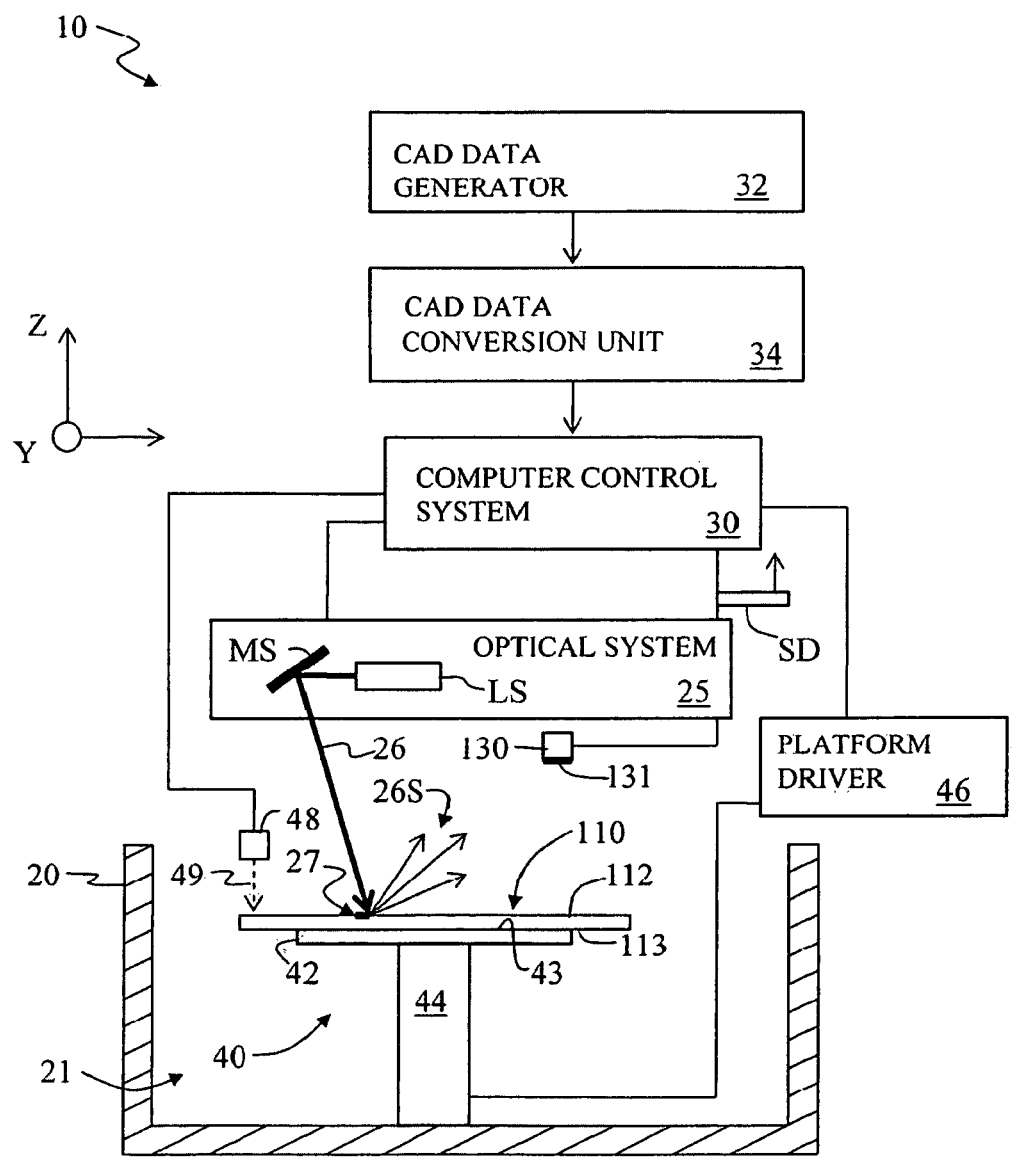
FIG. 3 is a schematic diagram of the stereolithography system of FIG. 1, and that further includes an example embodiment of the calibration apparatus according to the present invention that allows for carrying out the calibration methods of the present invention.

FIG. 3 is a schematic diagram of the stereolithography system 10 of FIG. 1, and which further includes an example embodiment of the calibration apparatus according to the present invention that allows for carrying out the calibration methods of the present invention. Calibration apparatus includes a calibration plate 110 having upper and lower surfaces 112 and 114, and which is arranged with its lower surface resting upon platform surface 43. Details of example calibration plates 110 are discussed in greater detail below.

Calibration apparatus also includes a photodetector 130 arranged above (i.e., in the +Z direction relative to) calibration plate upper surface 112 so as to be out of the way of light beam 26. In an example embodiment, photodetector 130 comprises a Si-PIN photodiode having, for example, a 5.8 mm diameter and a wide wavelength-detection range of 190 nm to 1100 nm. Other types of photodetector that are able to detect light at UV wavelengths (or other wavelengths as required) can also be used, such as GaP-based and GaAsP-based detectors. Photodetector 130 generates an electrical detector signal SD in response to detecting light, as described in greater detail below. In an example embodiment, an optical filter 131 having a bandpass of $\Delta\lambda$ centered on the actinic wavelength $\lambda_0$ is used to limit the detection process to substantially the actinic wavelength $\lambda_0$.

First Example Calibration Plate

Figure 4:
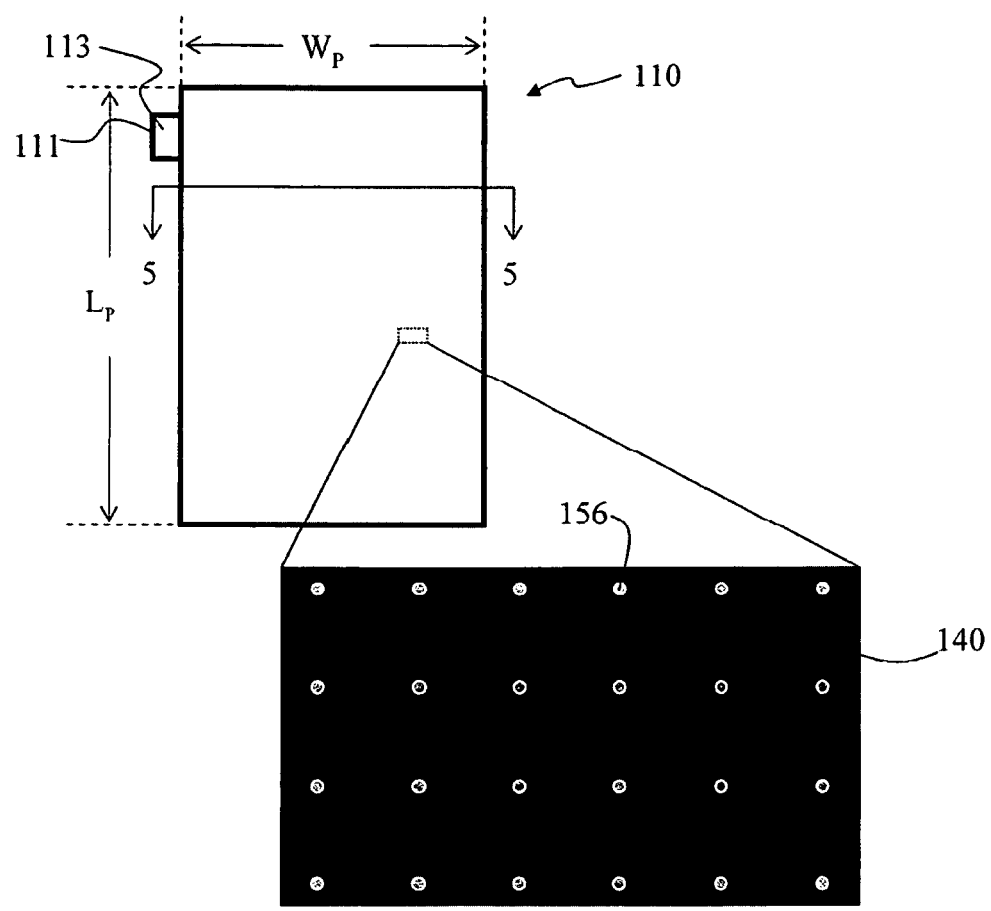
FIG. 4 is a plan view of an example embodiment of the calibration plate according to the present invention and also shows a close-up view (inset) of an example calibration plate surface that includes a periodic array of round fiducial marks.
Figure 5:
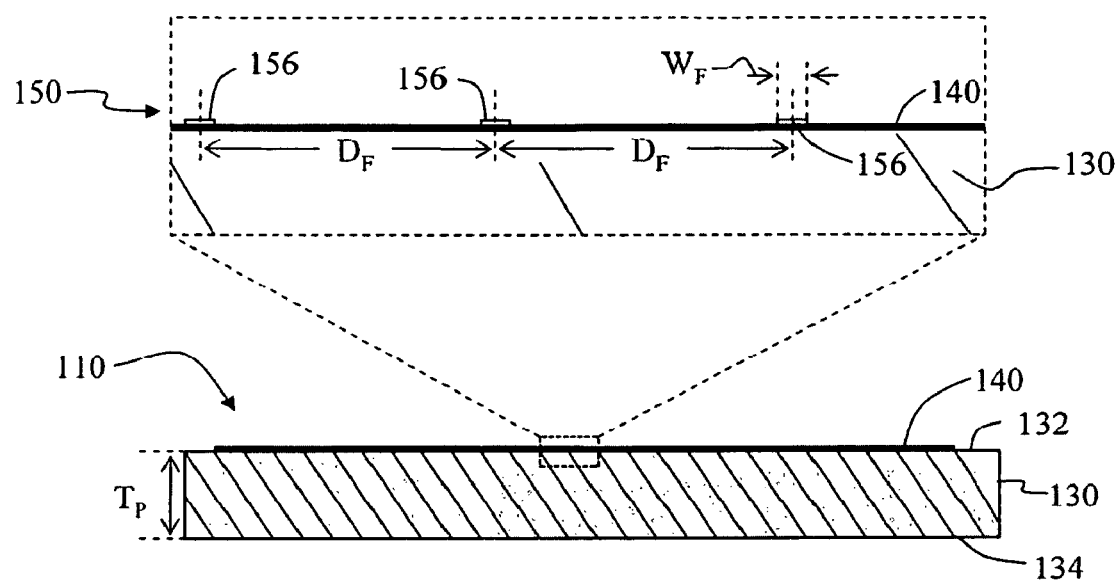
FIG. 5 is a cross-sectional view of an example embodiment of the calibration plate of FIG. 4 as taken along the line 5-5, along with a close-up view (inset) of the calibration plate surface.

FIG. 4 is a plan view of a first example embodiment of calibration plate 110, and FIG. 5 is a cross-sectional view of the calibration plate of FIG. 4 taken along the line 5-5. Calibration plate 110 includes a rigid, planar substrate 130 having flat upper and lower surfaces 132 and 134. Substrate 130 has a width $W_P$, a length $L_P$ and a thickness $T_P$. An example material for substrate 130 is aluminum. In an example embodiment, substrate 130 is an aluminum plate having a generally uniform thickness $T_P$ in the range between about 0.5 inch to about 2 inch, and preferably about 0.75 inches. Also in an example embodiment, aluminum substrate upper surface 132 is formed so as have a flatness $FL \leq 0.005$ inch over any 20 inch span. In an example embodiment, a Blanchard grinding process (also called "rotary surface grinding") is used to achieve the required degree of surface flatness FL. In example embodiment, substrate 130 has a width in the range defined by 1 foot $\leq W_P \leq$ 3 foot, and a length in the range defined by 1 foot $\leq L_P \leq$ 4 foot. Other substrate sizes (including thicknesses) may also be used, with the size being limited only by the needs of the particular system 10, including the need to keep the sag of the substrate to a minimum. In an example embodiment, the size of substrate 130 defines the size of calibration plate 110.

In an example embodiment, calibration plate 110 includes a leveling tab 111 that extends outwardly and that has a surface 113 positioned relative to calibration plate surface 112. Leveling tab 111 is positioned so that its surface 113 resides underneath laser alignment system 48 and provides a reference surface for the precise leveling of calibration plate 110 in system 10.

Calibration plate upper surface 132 is configured so that it does not substantially scatter light (i.e., is substantially non-scattering), and preferably is configured to substantially absorb actinic light 26. To this end, in an example embodiment, calibration plate upper surface 132 includes a light-absorbing layer 140 formed thereon. In an example embodiment, light-absorbing layer 140 is formed via anodization, and is preferably formed using a photo-anodization. Light-absorbing layer can be formed using other techniques and/or other materials, such as dyes, paints, plastics, ceramics, etc.

Light-absorbing layer 140 is formed so that it can absorb substantial amounts of actinic light 26 in order to reduce unwanted scattering when light spot 27 is scanned over calibration plate 110 between fiducial marks as described below. In this sense, calibration plate upper surface 132 serves as a "dark" or "non-scattering" background.

Calibration plate 110 further includes a periodic array 150 of fiducial marks 156 formed on calibration plate upper surface 132, e.g., in or on light-absorbing layer 140. The plurality of fiducial marks 156 are formed so as to be able to scatter actinic light 26. In an example embodiment, fiducial marks comprise silver halide formed in light-absorbing layer 140 during the aforementioned photo-anodization process. FIG. 4 includes an inset that shows a close-up view of an example light-absorbing layer 140 with round fiducial marks 156. In an example embodiment, fiducial marks 156 are about the same size as laser spot 27.

In an example embodiment, fiducial marks 156 are formed in a photosensitive anodized aluminum substrate surface 132 using computer numerically controlled (CNC) milling to create the fiducial marks. Further embodiments provide alternative techniques and/or materials for providing the plurality of fiducial marks on the substrate surface. The fiducial marks are associated with the surface of the substrate by being positioned on, in, within, or otherwise connected or proximate to the surface of the substrate.

In an example embodiment, fiducial marks 156 are separated by a center-to-center distance $D_F$ and have a width $W_F$. Fiducial marks 156 preferably have a center-to-center spacing $D_F$ of no greater than 1 inch, more preferably no greater than 0.5 inch, and still more preferably of about 0.25 inch. Fiducial marks 156 preferably have a width $W_F$ of no more than 0.005 inch, more preferably no more than 0.004 inch, and still more preferably in the range defined by 0.002 inch $\leq W_F \leq$ 0.004 inch. The placement accuracy of fiducial mark 156 is preferably equal to or greater than 0.001 inch.

Figure 6:
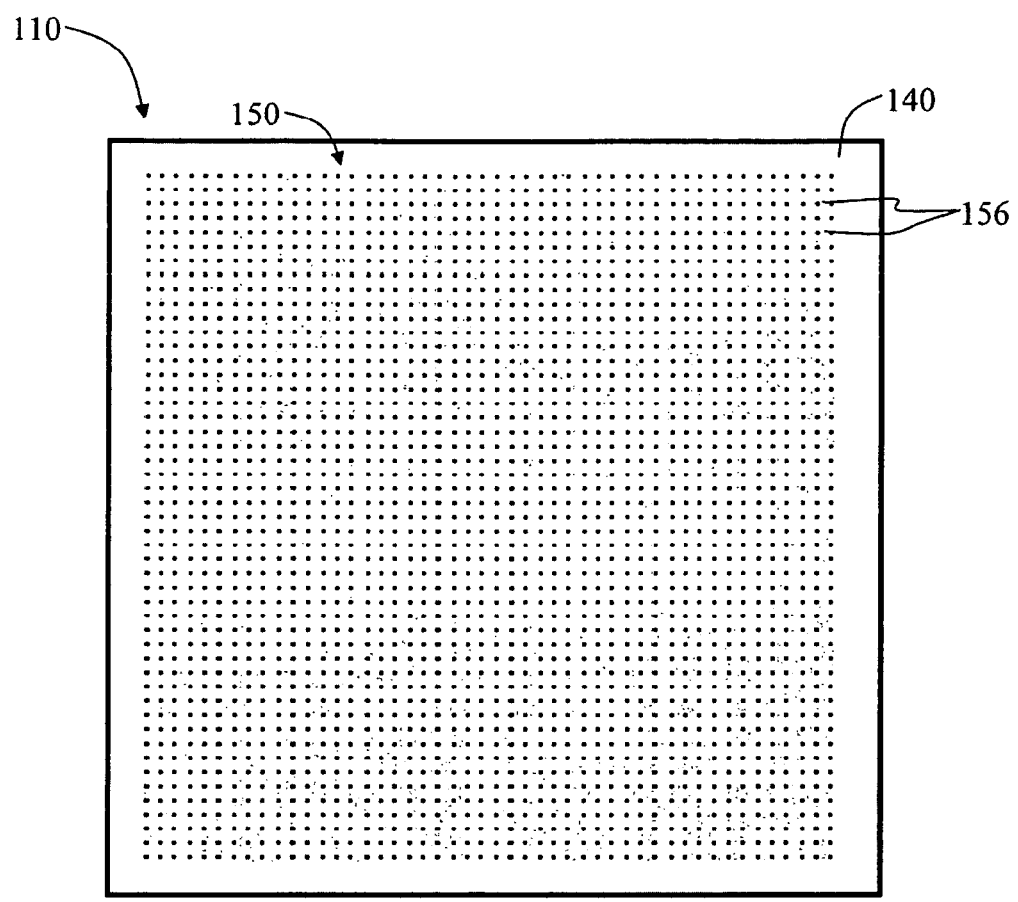
FIG. 6 is an example embodiment of a 1 foot×1 foot calibration plate that has fiducial marks every 0.25 inch and that includes 48×48=2,304 fiducial marks, with the calibration plate surface and the marks shown in reverse contrast for ease of illustration.

Example calibration plates 110 includes, for example, between 1,000 and 20,000 fiducial marks 156. FIG. 6 is an example embodiment of a 1 foot×1 foot calibration plate that has fiducial marks spaced apart by distance $D_F$=0.25 inch and so includes 48×48=2,304 fiducial marks 156. Note that the calibration plate of FIG. 6 is shown in negative contrast, i.e., the background surface 140 is shown as white and the fiducial marks are shown as black, for ease of illustration.

A 2 foot×3 foot version of the calibration plate 110 of FIG. 6 includes about 13,824 fiducial marks 156. However, other numbers of fiducial marks 156 outside of the above range can be used, depending upon the calibration plate dimensions, and the spacing $D_F$ between the fiducial marks.

Figure 7A:
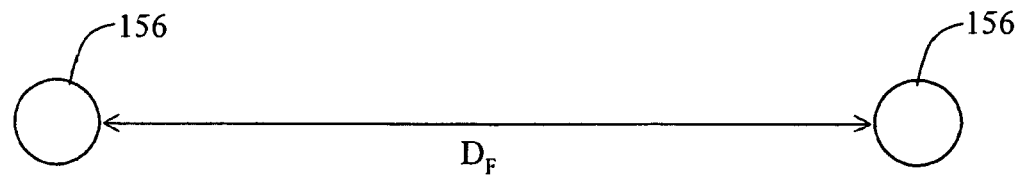
FIG. 7A is a schematic plan view of two adjacent round fiducial marks.
Figure 7B:
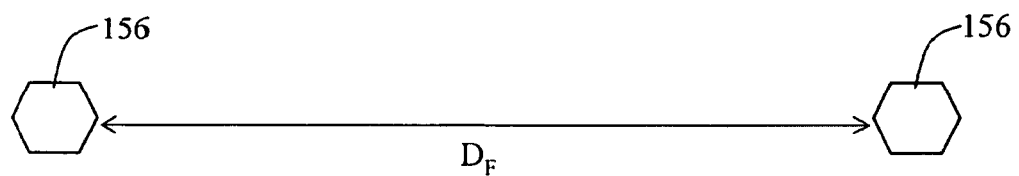
FIG. 7B is a schematic plan view of two adjacent hexagonal fiducial marks.
Figure 7C:
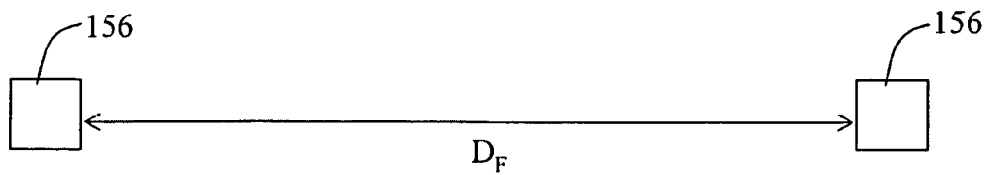
FIG. 7C is a schematic plan view of two adjacent square fiducial marks.

Various shapes can be used for fiducial marks 156, such as circles (FIG. 7A), hexagons (FIG. 7B) and squares (FIG. 7C). Other shapes, such as crosses, box-in-a-box, and other types of polygons or curved shapes can also be used. Generally, fiducial marks 156 can be any shape that can be scanned with laser spot 70 so as to provide a central (x,y) position of the mark using the detected scattered light and an appropriate algorithm.

Second Example Calibration Plate

The calibration plate 110 described above uses a single thick substrate 130, which can be relatively expensive to replace. For example, 2 foot×3 foot aluminum substrate 130 having a thickness of 0.75 inch costs about $2,000 once its surface 132 is polished to a high degree of flatness. If surface 132 is scratched or damaged, the entire calibration plate has to be replaced.

Figure 8:
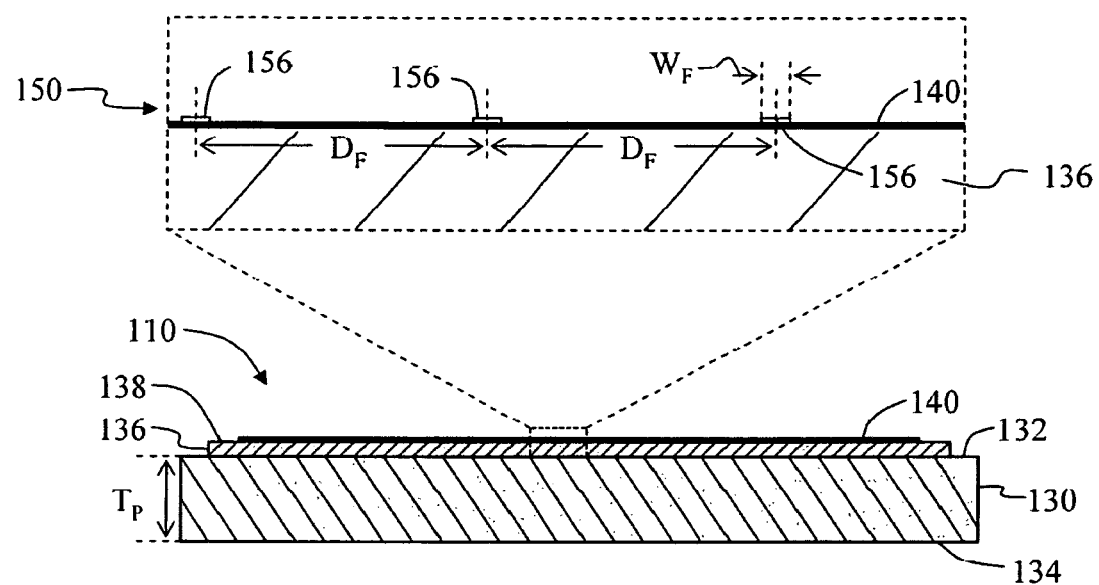
FIG. 8 a schematic side view of an example embodiment of a calibration plate similar to that of FIG. 5 but wherein the calibration plate includes a relatively thick support plate that supports a relative thin "target plate" that includes the fiducial marks.

FIG. 8 provides a schematic side view similar to that of FIG. 5 but illustrates a second example embodiment of calibration plate 110 that includes substrate 130 as a first support substrate or "support plate" that is substantially inflexible, and a second thin substrate 136 or "target plate" supported by substrate 130 on upper surface 132 and that is substantially flexible. Substrate 136 has an upper surface 138 on which light-absorbing layer 140 and the plurality of fiducial marks 156 are formed. In this embodiment, substrate surface 132 need not be anodized. Substrate 136 is preferably aluminum and is relatively thin, e.g., having a thickness in the range from about 0.0015 inch to about 0.004 inch, and preferably about 0.002 inch. The thickness of substrate 136 is preferably selected so that it can conform to the flatness FL of surface 132 of underlying substrate 130. In an example embodiment, substrate 136 is adhered to surface 132 of substrate 130 using alcohol and the resultant surface tension.

An advantage of the two-substrate embodiment of calibration plate 110 is that if surface 138 that carries array 150 of fiducial marks 156 is damaged, then only the relatively thin substrate 136 needs to be replaced at a cost of about $200.

Calibration Method

Figure 9:
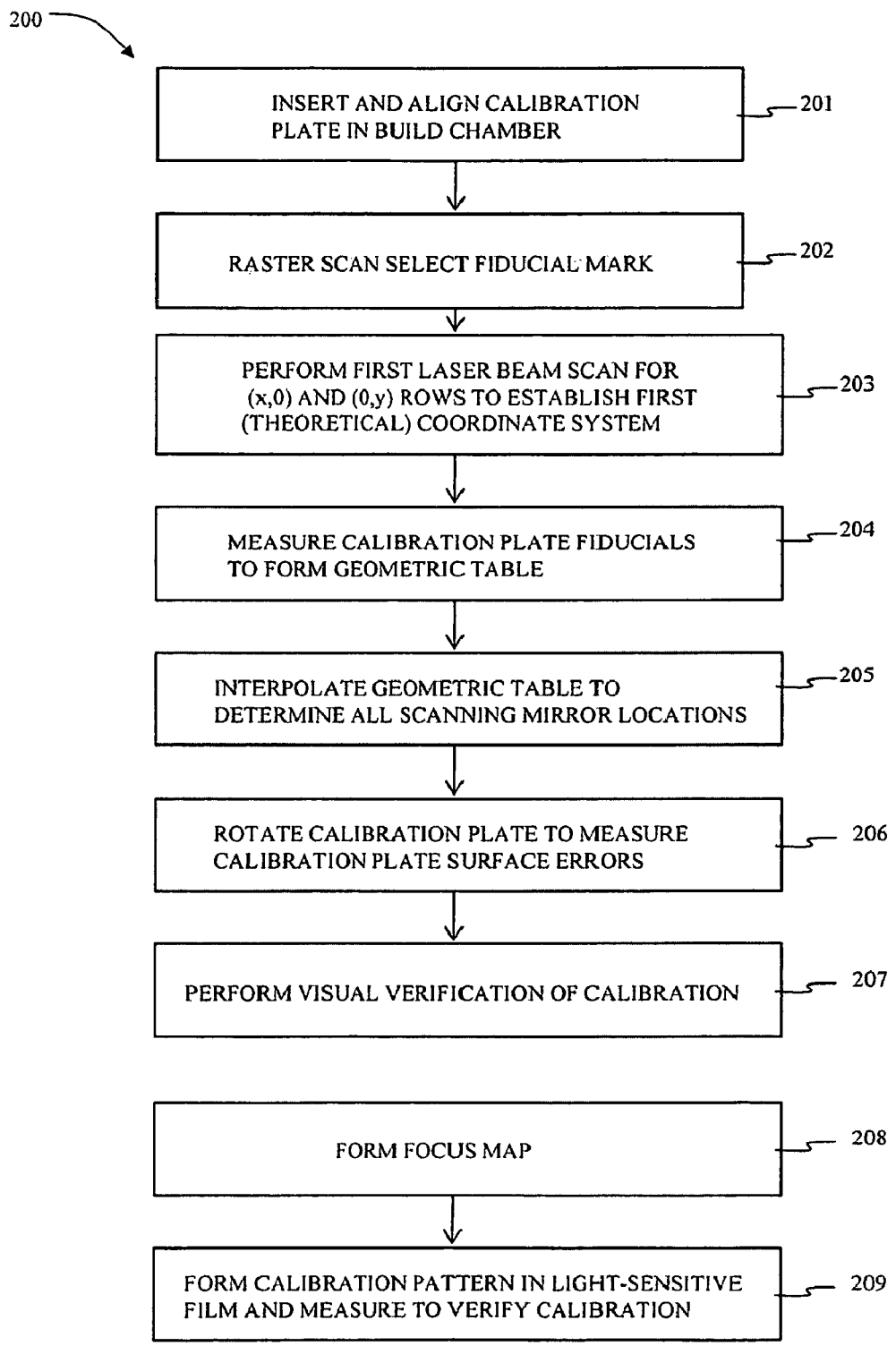
FIG. 9 is a flow diagram of an example embodiment of a general calibration method according to the present invention.
Figure 10A:
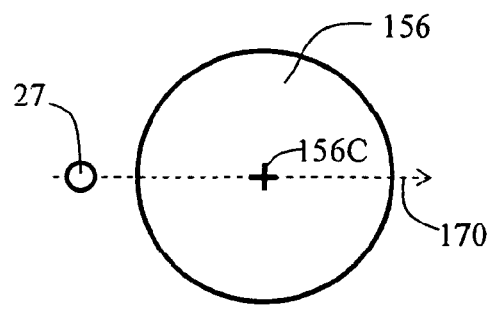
FIGS. 10A-10D are close-up plan views of an example round fiducial mark illustrating how the light beam is raster scanned over the fiducial mark in two-dimensions to determine a fiducial mark central position.
Figure 10B:
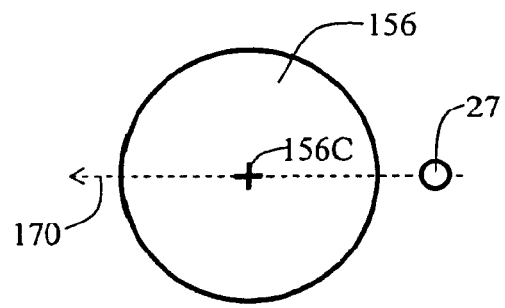
Figure 10C:
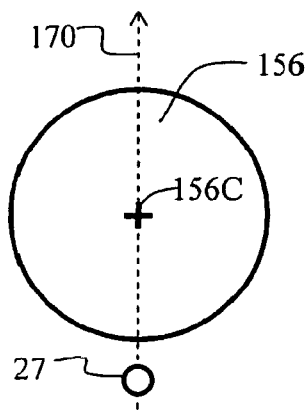
Figure 10D:
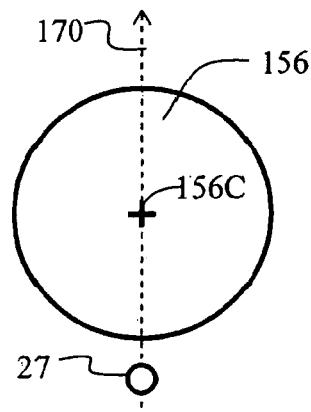

The method of a preferred embodiment of the present invention is set forth below with reference to flow diagram 200 of FIG. 9. The example calibration method can be used before shipment and/or after setup at the manufacturing location. If any mechanical shifting, laser removal or substantial laser drift occurs, the calibration procedure should be repeated.

In step 201, calibration plate 110 is inserted into build chamber 21 of system 10 so that calibration plate surface 112 is substantially co-planar with build plane 23. As described above, in an example embodiment, calibration plate 110 includes a leveling tab 111 used to precisely level the calibration plate within system 10. The leveling tab 111 or other features of the calibration plate 110 may be used to align or otherwise orient the calibration plate relative to the solid-imaging system.

In step 202, light beam 26 is guided to a fiducial mark 156 and a test profile of the fiducial mark is carried out. This involves, for example, a two-dimensional (2D) raster-scan of the particular fiducial mark 156 in the X- and Y-directions.

FIGS. 10A-10D are close-up plan views of an example fiducial mark 156 illustrating how light beam 26 is raster scanned over the fiducial mark in the X- and Y-directions during the profiling process in order to determine a "best location" or "center position" 156C for the fiducial mark. Dotted arrow 170 indicates the scan direction of light spot 27.

Data from the 2D raster scan of the selected fiducial mark 156 is then used to deduce the center position 156C of the fiducial mark, and the proper contrast and black-level for scanning the entire calibration plate 110. In an example embodiment, center position 156C is determined by using two different algorithms, such as a centroid algorithm and a Gaussian approximation algorithm. Both algorithms must agree as to the determination of center position 156C to within a very small margin of error (e.g., <0.001 inch), or the raster scan of the fiducial mark is repeated. Other algorithms or approaches for determining center position 156C may also be used alone or in combination. The laser power is automatically adjusted by computer control system 30 for each raster scan or "profile" in a closed loop, to maximize contrast. In an example embodiment, some fiducial marks 156 are "profiled" more than once for measurement redundancy.

Figure 11A:
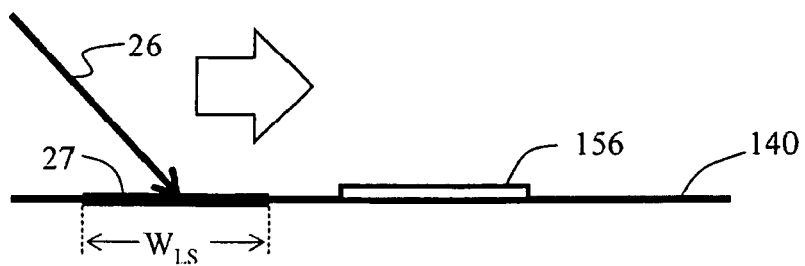
FIGS. 11A-11C are close-up cross-sectional views of an example fiducial mark and the surrounding non-scattering layer showing the light beam prior to, during, and after passing over the fiducial mark while scanning the calibration plate.
Figure 11B:
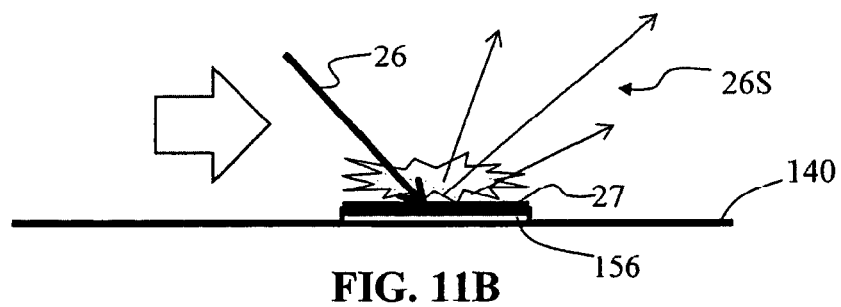
Figure 11C:
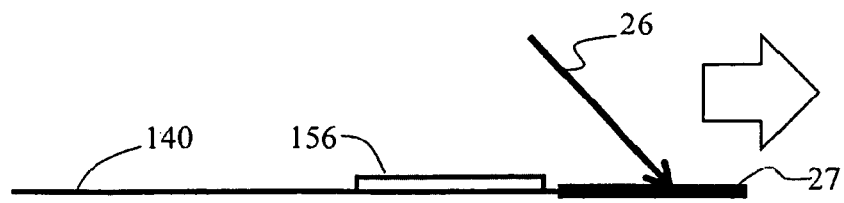

FIGS. 11A-11C are close-up cross-sectional views of an example fiducial mark 156 and light-absorbing layer 140 showing light beam 26 prior to, during, and after passing over the fiducial mark while scanning calibration plate 110. In FIG. 11B, light spot 27 substantially overlaps fiducial mark 156 to form scattered light 26S, which is detected by detector 130 (FIG. 3). In between fiducial marks 156, light beam 26 is generally absorbed by light-absorbing layer 140 when light spot 27 passes between fiducial marks 156 so that essentially no light is scattered to detector 130.

With reference again to FIG. 9 and flow diagram 200, in step 203, the X-axis and Y-axis are identified by performing a first (or initial) beam scan of one row and one column of fiducial marks 156 in the middle of calibration plate 110, i.e., a middle row in the X direction (x, 0), then the middle column in the Y direction (0,y). Note that in general the first beam scan can be along any two orthogonal rows/columns ("orthogonal rows") of fiducial marks 156. However, selecting the middle row and the middle column is preferred in the example embodiments of the present invention to establish the origin of the Cartesian coordinate system in the middle of calibration plate 110.

The procedure preferably involves using a relatively large laser spot size to first or initial scan a relatively large area. In an example embodiment, laser spot 27 width $W_{LS}$ is about four times the width $W_F$ of the fiducial mark 156 to be found, so that for a fiducial mark width $W_F$=0.03 inch, the laser spot width $W_{LS}$ is about 0.12 inch. This first, relatively wide scan is performed for each fiducial mark 156 for one row and one column, and preferably the middle row and middle column. The use of a relative wide laser spot 27 ensures that fiducial marks 156 are found within the first scan. After all fiducial marks 156 in the middle row and middle column are located, the theoretical positions of the remaining fiducial marks 156 of the calibration plate 110 are determined by calculation.

This initial scan provides important information that solves for most of the theoretical model parameters, including rotation, offset, mirror distance, second mirror to plane distance, angle of entry, and angle of exit at origin. These theoretical model parameters are obtained for all fiducial marks by employing known regression analysis techniques using the equations described above, and based upon the data collected for the middle row and middle column. The regression analysis iteration is continued until the RMS error is less than 0.005 inch. This theoretical model allows for quick scans of the remaining fiducial marks 156 in a second scan, as described below. For example, rather than scanning each fiducial mark with a relatively large laser spot 27 (e.g., $W_{LS}$~0.12 inch), as was done for the middle row and middle column as described above in connection with the initial scan, the remaining fiducial marks are scanned in the second scan using a narrower laser spot 27, e.g., $W_{LS}$=0.040 inch.

By moving mirrors MX and MY in small angular increments $d\theta_X$ and $d\theta_Y$ to steer laser beam 26 in corresponding small Cartesian increments dY and dX, the angular movements of the mirrors versus the distance traveled is established and the theoretical origin of the initial coordinate system can be established.

If step 203 is successful, then the rotation, scale, and offset values are calculated and are used to create a first coordinate system or "theoretical model" that maps the mirror angular coordinates ($\theta_X$, $\theta_Y$) to the calibration plate X-Y coordinates. This theoretical model described above is used to predict the "theoretical" positions ($x_T$, $y_T$) of the other (i.e., non-scanned) fiducial marks 156. Because of imperfections in system 10 as a whole prior to calibration, there will generally be differences between the theoretical (center) positions ($x_T$, $y_T$) and the actual (center) positions ($x_A$, $y_A$) of the fiducial marks 156 as measured.

In step 204, at least a substantial portion of, and preferably all of fiducial marks 156 of calibration plate 110 are measured in a second (or "measurement") light beam scan to determine the actual center positions ($x_A$, $y_A$) of the scanned fiducial marks 156. This second scan uses the theoretical positions ($x_T$, $y_T$) to find fiducial marks 156. In an example embodiment, this full-scan process takes about 20 minutes for about 10,000 fiducial marks. This allows for the actual and theoretical center positions to be compared and the errors $$(\delta x, \delta y) = (x_A - x_T, y_A - y_T)$$

between the two measurements to be calculated. This in turn allows for the identification of local and global errors in the theoretical model introduced by imperfections in system 10.

Thus, in step 204, the actual center positions ($x_A$, $y_A$) as measured in the second scan are provided in a geometric table. In certain embodiments of the present invention, the geometric table includes the scanning mirror angular coordinate $\theta_x$ for every 0.25 inch increment of the Cartesian coordinate x along the X-axis and a scanning mirror angular coordinate $\theta_y$ for every 0.25 inch increment of the Cartesian coordinate y along the Y-axis In step 205, the geometric table established in step 204 is used to interpolate (e.g., using a fifth-order polynomial equation) all scanning mirror angular coordinates ($\theta_x$, $\theta_y$) to all the calibration plate (x,y) coordinates. This interpolation is created from an equation that governs the complete scan area, and thus is not susceptible to "tiling" errors, such as, local anomalies created by use of only the closest fiducial marks and using a simple averaging algorithm. These "interpolated coordinates" constitute calibrated coordinates ($x_C$, $y_C$) that can then be used by computer control system 30 to steer laser beam 26 when forming object 50. One example embodiment of the present invention performs the interpolation with a fourth-order, second-degree polynomial equation to smooth the collected data. From this smoothed data, a traditional bilinear interpolation is performed on the four closest surrounding data points in the geometric table to give the correct (i.e., "calibrated") $\theta_X$ and $\theta_Y$.

Accounting for Calibration Plate Errors

It is possible that calibration plate surface 112 can introduce errors into the calibration process. Any flatness or rotation errors (e.g., global and local flatness variations or rotations) will give rise to positional errors in the scanned data. The theoretical flatness of a suspended surface is known to follow a parabolic character and may be modeled. However, any discrepancy would not be known unless measured, and can change due to temperature and humidity.

Accordingly, in an example embodiment, the calibration method includes the optional step 206 in which calibration plate 110 is rotated (e.g., by 45° or 90°) and the first beam scan of the middle X-row and middle Y-row is repeated. If calibration plate surface 112 is not perfectly level, or if any flatness imperfections exist, or if the periodic array 150 of fiducial marks 156 has any rotational errors, then these discrepancies would now be rotated as well. If one X-row and one Y-row of fiducial marks 156 are scanned to determine any flatness and/or rotations errors or offsets, these errors can be accounted for in the ("theoretical") coordinate system. A similar technique involves lowering or raising calibration plate surface 112 to measure and compensate for any flatness errors.

The Focus Map

Because solid-imaging systems 10 often include a relatively large build plane 23, mirror-based optical system 25 must dynamically focus laser beam 26 as it traverses the build plane. Although focal distance mechanics is previously known, any moving part introduces its own offset and rotation error, thus translating the focused beam spot to a different location than intended. Accordingly, in step 207, using the interpolated coordinate information from step 205, a focus map is generated that provides the proper focus for laser beam 26 for a given (x,y) coordinate.

Calibration Verification

In an optional step 208, a visible verification process is carried out. The scanning mirrors use the geometric table to create vectors to irradiate select fiducials 156, which appear to "glow" when irradiated due to the aforementioned scattered light 26S. The select fiducials 156 can be irradiated in a select pattern that allows for a system user to perform visual verification of the calibration.

In another optional step 209 where more than visual calibration proof is required or warranted, a light-sensitive material such as black MYLAR film (not shown) or other polyester film or film of other material is provided and etched with a select calibration pattern (i.e., fiducial mark irradiation pattern) using laser beam 26 as steered using calibrated coordinates. The calibration patterns formed on the light-sensitive material is then inspected using traditional metrology methods to confirm the calibration of system 10.

Dual Scanning System

Figure 12:
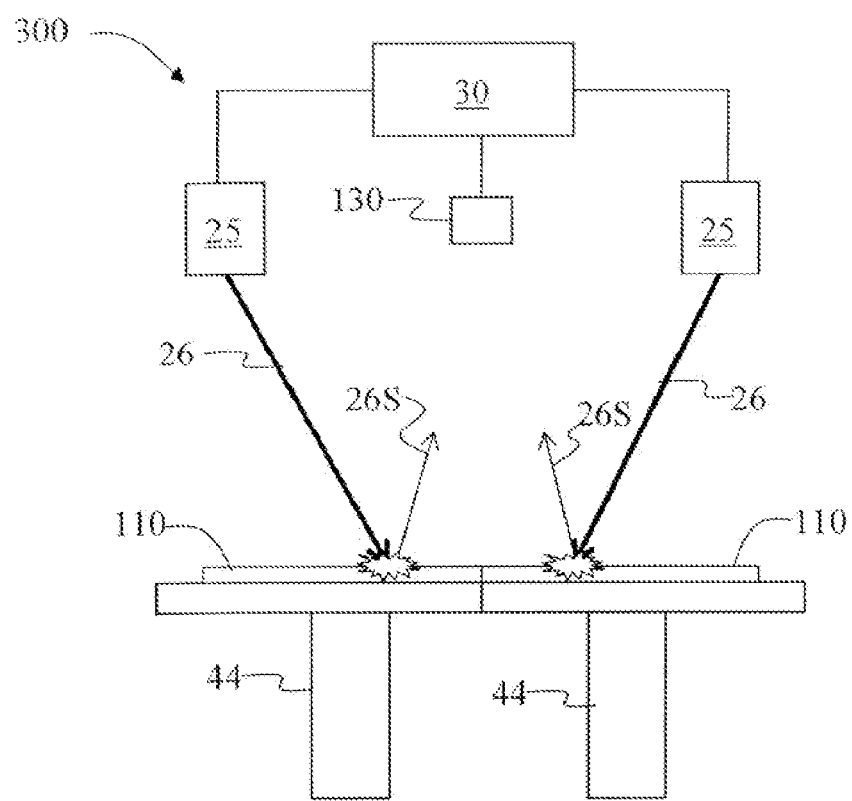
FIG. 12 is a schematic diagram of a dual stereolithographic system that utilizes two calibration plates to perform the dual system calibration.

After accommodating all of the above mentioned errors, it is possible to add another scanning system adjacent thereto so as to increase the build plane size. FIG. 12 is a schematic diagram of a dual stereolithographic system 300 that includes two build chambers operably arranged side by side, and wherein two calibration plates 110 are used to perform the calibration in the manner described above. This dual stereolithographic system 330 may include a computer control system 30 that controls separate mirror-based optical systems 25 to move the light beam, generated by a single light beam generator (not shown) or by separate light beam generators. In certain embodiments the sets of data points may be used to calibrate for the respective build chamber; however, in other embodiments, the sets of data points may be used to stitch the calibration data together to form a single calibration data set for a single (combined) build chamber.

Many modifications and other embodiments of the invention set forth herein with come to mind to one skilled in the art to which the invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. It is intended that the present invention cover the modifications and variations of this invention provided they come within the scope of the appended claims and their equivalents. Although specific terms are employed herein, they are used in a generic and descriptive sense only and not for purposes of limitation.

What is claimed is:

1. A method of using a solid-imaging system to form a three-dimensional object using a scanning light beam, comprising:
    a) operably disposing a calibration plate in the system where the object is formed, the calibration plate having a plurality of fiducial marks formed on a first surface comprising a light-absorbing material, wherein the fiducial marks are configured to scatter the actinic light;
    b) scanning the light beam over the fiducial marks and detecting scattered light therefrom so as to measure corresponding center positions of the scanned fiducial marks; and
    c) forming the object by directing the light beam based on the measured center positions.

2. The method of claim 1, further comprising, prior to scanning the light beam over the fiducial marks, performing an initial light beam scan over first and second orthogonal rows of fiducial marks and detecting scattered light therefrom so as to establish a first coordinate system.

3. The method of claim 2, further comprising, prior to forming the object, interpolating the measured center positions and the angular positions of the mirrors to establish a calibrated relationship between mirror angular positions and (x,y) positions where the object is formed, and then using the calibrated relationship to form the object.

4. The method of claim 2, wherein the light beam is a laser beam having an adjustable spot size.

5. The method of claim 4, further comprising:
adjusting the laser beam spot size so that it is has a larger width during the initial light beam scan than during the scanning of the light beam over the fiducial marks to measure corresponding center positions of the scanned fiducial marks.

6. The method of claim 1, further comprising:
raster scanning one of the fiducial marks to establish a scanning contrast level.

7. The method of claim 1, further comprising, prior to operably disposing a calibration plate in the system, forming the calibration plate using a photo-anodization process.

8. The method of claim 1, wherein measuring of the corresponding center positions of the scanned fiducial marks includes applying at least one of a first parabolic approximation and a centroid approximation to the detected scattered light from the scanned fiducial marks.

9. A method of calibrating a solid-imaging system that forms a three-dimensional object and that has a mirror-based optical system having mirrors with adjustable angular positions for steering a light beam having an actinic wavelength and that has an elevator system that movably supports a build platform having a corresponding build plane, the method comprising:
(a) operably disposing a calibration plate onto the build platform, the calibration plate having a plurality of fiducial marks formed on a first surface comprising a light-absorbing material, wherein the fiducial marks are configured to scatter the actinic light;
(b) performing a first light beam scan over first and second orthogonal rows of fiducial marks and detecting scattered light therefrom so as to establish a first coordinate system;
(c) using the first coordinate system, performing a second light beam scan over at least a portion of the array of fiducial marks and detecting scattered light therefrom so as to measure corresponding center positions of the scanned fiducial marks; and
(d) interpolating the measured center positions and the angular positions of the mirrors to establish a calibrated relationship between mirror angular positions and (x,y) build plane positions.

10. The method of claim 9, further comprising:
(e) using the interpolated relationship between the measured center positions and the angular positions of the mirrors and (x,y) positions at the build plane to steer the laser beam when forming the object.

11. The method of claim 9, wherein the measured fiducial mark center positions are determined by raster scanning the fiducial marks in orthogonal directions.

12. The method of claim 9, wherein measuring corresponding center positions of the scanned fiducial marks includes applying at least one of a first parabolic approximation and a centroid approximation to the detected scattered light from the scanned fiducial marks.

13. The method of claim 9, wherein establishing the first coordinate system includes measuring values for at least one of rotation, scale and offset.

14. The method of claim 9, further including prior to forming the object:
removing the calibration plate;
arranging a light-sensitive material on the build platform;
steering the laser beam using the interpolated relationship between the measured center positions and the angular positions of the mirrors and (x,y) positions at the build plane; and
measuring the pattern formed in the light-sensitive material to assess the quality of the calibration.

15. The method of claim 14, wherein the light-sensitive material comprises MYLAR.

16. The method of claim 9, wherein establishing the first coordinate system includes: calculating theoretical center positions of the scanned fiducial marks of the first light beam scan; and
calculating the theoretical centers of fiducial marks not scanned in the first light beam scan using interpolation.

17. The method of claim 9, including forming the fiducial marks as either round dots, square dots, or hexagonal dots, wherein the dots have a diameter of about 0.030 inch with a center-to-center spacing of about 0.25 inch.

18. The method of claim 9, wherein the light beam has an associated spot size, and wherein second light beam scan is performed with a spot size smaller than that used for the first light beam scan.

19. The method of claim 9, further including:
rotating the calibration plate and repeating the first light beam scan over first and second orthogonal rows of fiducial marks and detecting scattered light therefrom so as to establish a third coordinate system; and
comparing the first and third coordinate systems and determining if there are differences therebetween that are indicative of one or more calibration plate errors.

20. The method of claim 9, further including prior to performing the first laser beam scan:
raster scanning one of the fiducial marks to establish a scanning contrast level.

* * * * *